(12) United States Patent
Jin et al.

(10) Patent No.: US 6,574,026 B2
(45) Date of Patent: Jun. 3, 2003

(54) MAGNETICALLY-PACKAGED OPTICAL MEMS DEVICE

(75) Inventors: Sungho Jin, Millington, NJ (US); Hyongsok Soh, Basking Ridge, NJ (US)

(73) Assignees: Agere Systems Inc., Allentown, PA (US); Lucent Technologies, Murray Hill, NJ (US)

( * ) Notice: Subject to any disclaimer, the term of this patent is extended or adjusted under 35 U.S.C. 154(b) by 70 days.

(21) Appl. No.: 09/731,493

(22) Filed: Dec. 7, 2000

(65) Prior Publication Data

US 2002/0071166 A1 Jun. 13, 2002

(51) Int. Cl.[7] .............................................. G02B 26/08
(52) U.S. Cl. ........................................ 359/224; 385/18
(58) Field of Search ................................. 359/223, 224, 359/225, 226, 838, 290, 291, 872; 385/17, 18

(56) References Cited

U.S. PATENT DOCUMENTS 6,256,430 B1 * 7/2001 Jin et al. ...................... 385/17

\* cited by examiner

*Primary Examiner*—Euncha Cherry
(74) *Attorney, Agent, or Firm*—Lowenstein Sandler PC

(57) ABSTRACT

In accordance with the invention, the component layer, the spacer and the actuator layer of a MEMs device are assembled at ambient temperature and held together in lateral alignment by upper and lower magnets. Such ambient temperature magnetic packaging greatly minimizes the undesirable exposure of the sensitive MEMs components to high temperatures. The resulting MEMs device exhibits the high dimensional accuracy and stability. In a preferred embodiment, the component layer comprises a layer of movable mirrors and a spacer aerodynamically and electrostatically isolates each mirror, minimizing cross-talk between adjacent mirrors.

27 Claims, 14 Drawing Sheets

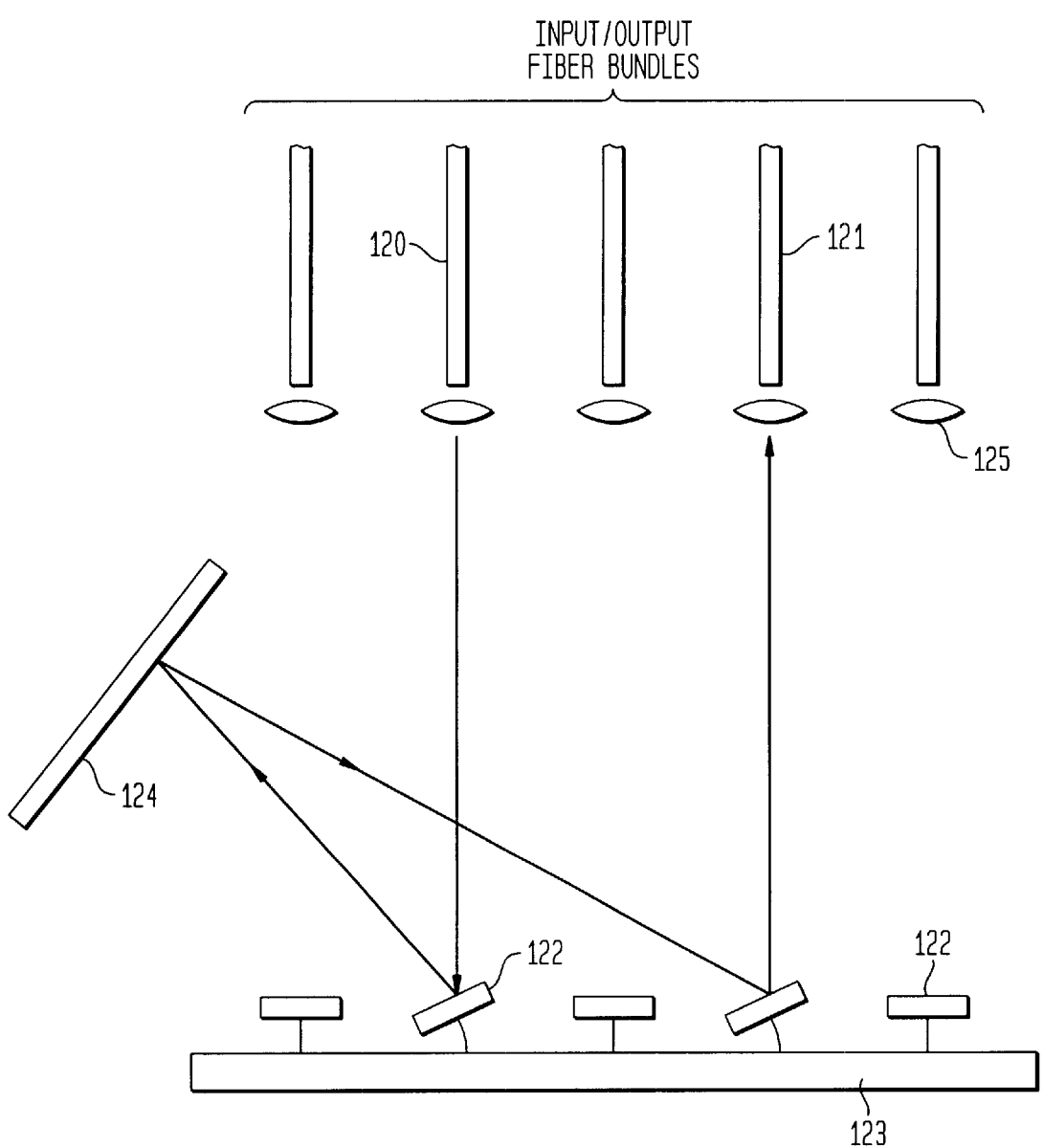

MAGNETICALLY-PACKAGED OPTICAL MEMS DEVICE

FIELD OF THE INVENTION

The present invention relates to optical micro-electro-mechanical devices ("MEMs devices") and, in particular, to magnetically packaged MEMs devices. The inventive MEMs devices are particularly useful as movable mirror devices for beam steering in optical communication systems.

BACKGROUND OF THE INVENTION

Optical MEMs devices are of considerable importance in optical communication systems. In one important application, a MEMs device provides a two-dimensional array of movable components, such as mirrors, to receive signals from optical input fibers. Each movable component in the array can be electrically moved in relation to the received optical input.

A typical MEMs mirror device comprises an array of metal-coated silicon mirrors, each mirror movably coupled to a surrounding silicon frame via a gimbal. Two torsional members on opposite sides of the mirror connect the mirror to the gimbal and define the mirror's axis of rotation. The gimbal, in turn, is coupled to the surrounding silicon frame via two torsional members defining a second axis of rotation orthogonal to that of the mirror. A light beam can therefore be steered in any direction.

Electrodes are disposed in a cavity underlying the mirror and the gimbal. Voltages applied between the mirror and an underlying electrode and between the gimbal and an electrode control the orientation of the mirror. Alternatively, in slightly modified arrangements, an electrical signal can control the position of the mirror magnetically or piezoelectrically.

FIGS. 1(a) and 1(b) illustrate conventional optical MEMs devices and their application. FIG. 1(a) shows a typical prior art optical MEMs mirror structure. The device comprises a mirror 10 coupled to a gimbal 11 on a polysilicon frame 12. The components are fabricated on a substrate 9 by micromachining processes such as multilayer deposition and selective etching. After etching, mirror assembly (10, 11, 12) is raised above the substrate 9 by upward bending lift arms 13 during a release process. The mirror 10 in this example is double-gimbal cantilevered and attached onto the frame structure 12 by springs 14. The mirrors can be tilted to any desired orientation for optical signal routing via electrostatic or other actuation with electrical voltage or current supplied as to electrodes 16 from outside. The light-reflecting surface of mirror 10 comprises a metal-coated polysilicon membrane, which is typically of circular shape. The metal layers 15 are deposited by known thin film deposition methods such as evaporation, sputtering, electrochemical deposition, or chemical vapor deposition.

FIG. 1(b) schematically illustrates an important application of optical MEMs mirrors as controllable mirror arrays for optical signal routing. The cross connect system shown here comprises optical input fibers 120, optical output fibers 121 and an array of MEMs mirrors 122 on a substrate 123. The optical signals from the input fibers 120 are incident on aligned mirrors 122. The mirrors 122, with the aid of a fixed auxiliary mirror 124 and appropriate imaging lenses 125, are electrically controlled to reflect the incident optical signals to respective output fibers 121. In alternative schemes, the input fibers and the output fibers are in separate arrays, and a pair of MEMs mirror arrays are used to perform the cross connect function.

The tilting of each mirror is controlled by applying specific electric fields to one or more of the electrodes (not shown) beneath the mirror. Undesirable variations in the gap spacing between the mirror layer and the electrode layer alter the electric field, which affects the degree of mirror tilting. This in turn alters the path or coherency of light signals reaching the receiving fibers, thus increasing the signal loss during beam steering.

An array of such MEMs mirrors is essentially composed of two layers: a component layer comprising the array of mirror elements movably coupled to a surrounding frame and an actuator layer comprising the electrodes and conductive paths needed for electrical control of the mirrors. One approach to fabricating the array is to fabricate the actuator layer and the component layer as successive layers on the same workpiece and then to lift up the component layer above the actuator layer using vertical thermal actuators or stresses in thin films. This lift-up process is described in U.S. patent application Ser. No. 09/415,178 filed by V. A. Aksyuk et al. on Nov. 8, 1999 and assigned to applicant's assignee.

An alternative approach is to fabricate the component layer on one substrate, the actuator layer on a separate substrate and then to assemble the mating parts with accurate alignment and spacing. The two-part assembly process is described in U.S. Pat. No. 5,629,790 issued to Neukermans et al. on May 13, 1997 and in U.S. patent application Ser. No. 09/559,216 filed by Greywall on Apr. 26, 2000, both of which are incorporated herein by reference. This two-part assembly provides a more robust structure, greater component packing density and permits larger component sizes and rotation angles as well as scalability to larger arrays.

In the two-part assembly process, the component layer and the actuator layer are conventionally bonded together for mechanical sturdiness and long-term reliability. Neukermans et al. and Greywall suggest anodic bonding, solder glass bonding, and epoxy bonding. U.S. patent application Ser. No. 09/705,350, filed by D. W. Carr et al. on Nov. 3, 2000, patented U.S. Pat. No. 6,442,307 describes solder bonding of the layers. The gap spacing between the component layer and the actuator layer determines the electric field for the given magnitude of applied voltage (or the magnetic field for the given electrical current level). Therefore, an accurate and reliable establishment of the gap spacing during the assembly and bonding of the two layers, as well as the dimensional stability of the gap during device handling, shipping and operation are important. The accurate lateral alignment of the mating parts of the components and electrodes is also desirable for reliable operation.

To retain the accurate lateral alignment of the component layer and the actuator layer once the alignment is achieved, often requires high temperature bonding processes such as soldering at ~100–300° C., epoxy curing at ~100–200° C., polyimide curing at ~250–400° C., glass frit bonding (sometimes called glass solder bonding) at 400–700° C., or anodic bonding at 400–900° C. But the exposure of the MEMs components to temperatures even as low as ~150° C. can cause undesirable distortion or curvature. If the components are mirrors, heat can also cause metallurgical reactions at the interfaces between the mirror metallization and the silicon substrate with consequent contamination of the mirror metal, creep and dimensional changes, formation of brittle intermetallic compounds, and long-term reliability problems. The bowing or curving of the mirrors generally results in non-focused or non-parallel light reflection and loss of optical signal. Accordingly, there is a need for an assembly process that can be carried out at ambient temperature without having to expose the MEMS device to high temperature.

SUMMARY OF THE INVENTION

In accordance with the invention, the component layer, the spacer and the actuator layer of a MEMs device are assembled at ambient temperature and held together in lateral alignment by upper and lower magnets. Such ambient temperature magnetic packaging greatly minimizes the undesirable exposure of the sensitive MEMs components to high temperatures. The resulting MEMs device exhibits the high dimensional accuracy and stability. In a preferred embodiment, the component layer comprises a layer of movable mirrors and a spacer aerodynamically and electrostatically isolates each mirror, minimizing cross-talk between adjacent mirrors.

BRIEF DESCRIPTION OF THE DRAWINGS

The nature, advantages and various additional features of the invention will appear more fully upon consideration of the illustrative embodiments now to be described in detail with the accompanying drawings. In the drawings:

FIGS. 1(a) and 1(b) illustrate conventional MEMs devices and their application;

It is to be understood that the drawings are for purposes of illustrating the concepts of the invention and are not to scale.

DETAILED DESCRIPTION OF THE DRAWINGS

Figure 2A:
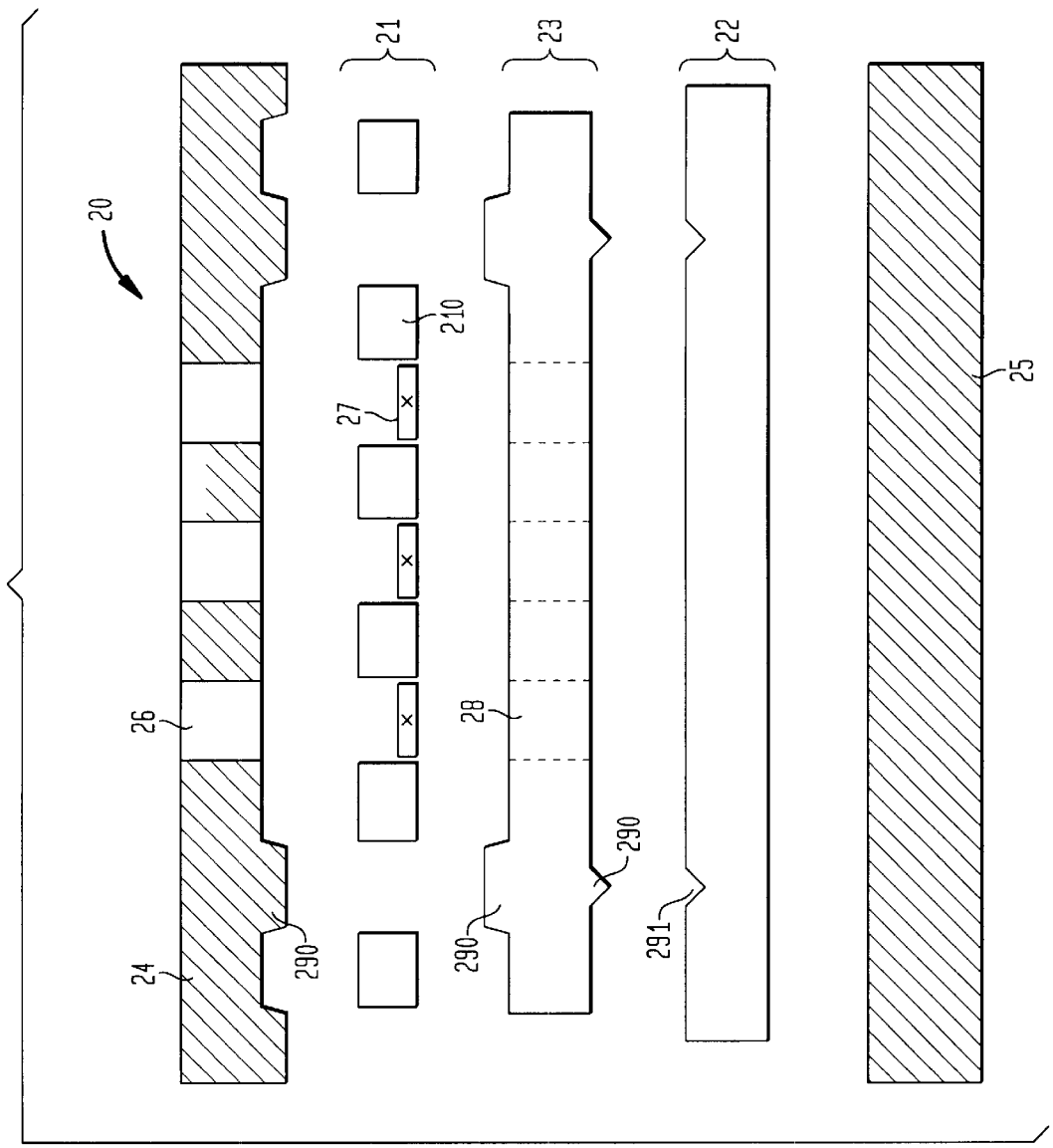
FIGS. 2(a) and 2(b) schematically illustrate assembly of a first embodiment of a magnetically packaged MEMs device in accordance with the invention.
Figure 2B:
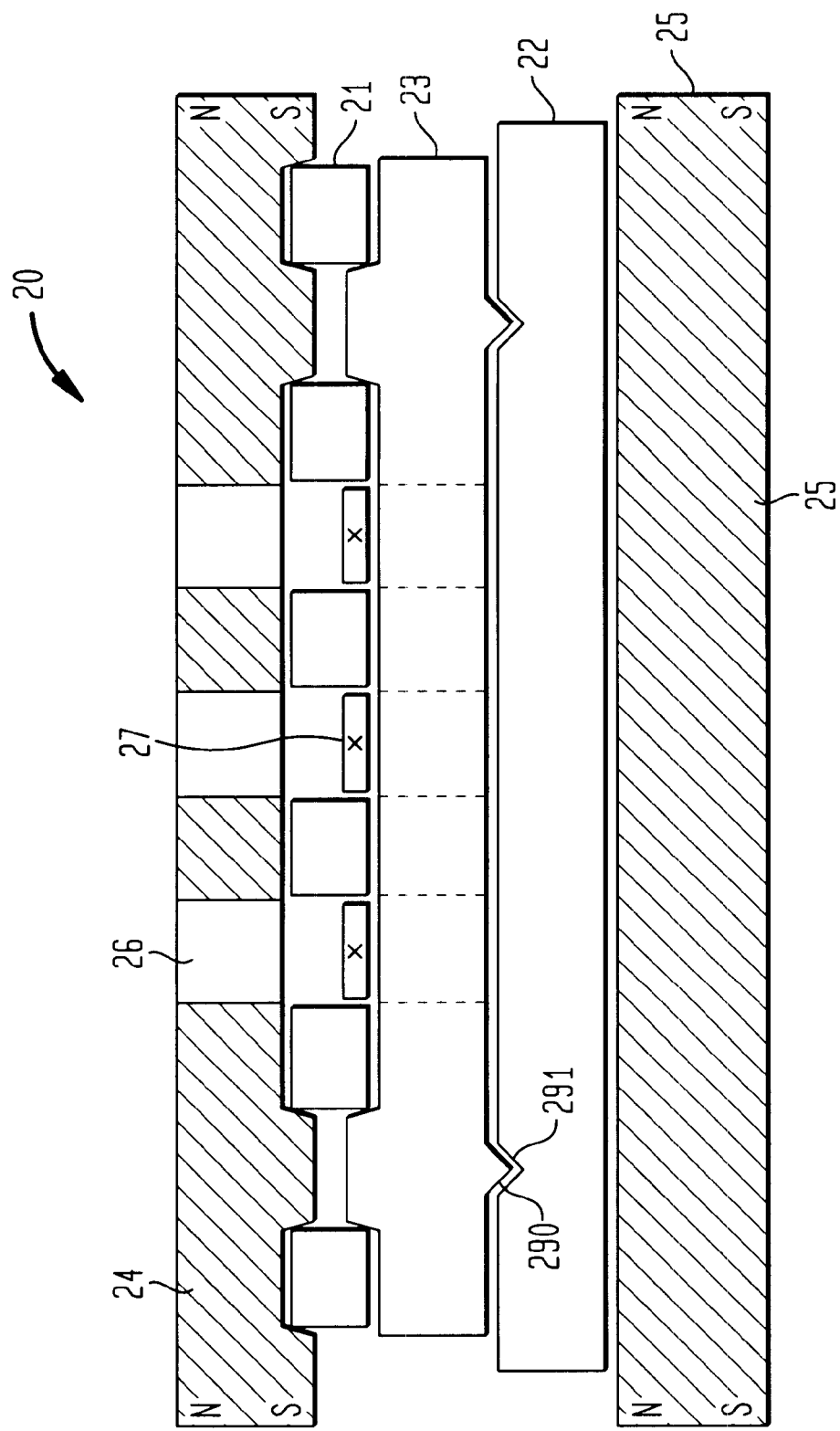

Referring to the drawings, FIGS. 2(a) and 2(b) schematically illustrate in cross section a magnetically packaged MEMs device 20. FIG. 2(a) shows the three basic parts of the MEMs device 20, i.e., a component layer 21 (here a mirror layer), an actuator layer 22 and a spacer 23, before they are assembled. Two magnets (upper magnetic cover 24 and lower magnetic cover 25) provide magnetic assembly. One of the magnets, e.g., the upper cover 24 can be soft magnetic material while the other magnet, e.g. cover 25, can be permanent magnetic material. (Alternative combinations such as the top magnet being permanent with the bottom magnet being soft, or both the top and the bottom being permanent can also be used.) The component layer, spacer, and actuator layer are laterally aligned, brought vertically close together, and locked in position by the attractive force of the magnets. The upper cover 24 includes openings 26 to permit the entry of light onto components 27, and spacer 23 has cavities 28 underlying the components 27. While the component layer will hereinafter be exemplified as a mirror layer, it should be understood that it can be an array of other optical components such as gratings, variable thickness slabs, polarizers, etc.

FIG. 2(b) illustrates the device 20 after assembly. The spacer 23 is disposed medially between the mirror layer 21 and the actuator layer 22. The magnet 24 is distal with respect to mirror layer 21, and magnet 25 is distal with respect to actuator layer 22. The assembled device desirably has accurate lateral (both in x-axis and y-axis) alignments of the mirror layer and the actuator layer. This can be ensured by self-aligning the protrusion features 290 in the spacer which fit into alignment slots 291 in the mirror and the actuator layers. The alignment should be accurate to less than 5% of the mirror diameter (for a mirror size of 1000 $\mu$m, less than 50 $\mu$m deviation), preferably less than 2%, and even more preferably less than 0.5%. If the mirror is not circular but has an oval, square or hexagonal shape, an equivalent diameter giving the same area may be used for the calculation of the alignment accuracy. If the mirror is rectangular, the short dimension of the rectangle may be used in the calculation of alignment accuracy.

The accuracy of the vertical gap between the mirror layer and the electrode layer determines the intensity of the MEMS actuating electrostatic field for a given applied voltage. The magnetic compressive force in the assembly of FIG. 2(b) ensures that the spacing is the essentially same as the thickness of the spacer 23. The desired accuracy of the spacing in the inventive structure is with less than 10% deviation from the spacer thickness, preferably less than 5%, even more preferably less than 2% deviation.

The mirror layer 21 and the actuator layer 22 advantageously have precisely positioned alignment slots 291 such as holes, V-shaped grooves, or depressed steps. These slots can be made by lithographic patterning and etching or laser drilling. The spacer 23 has protruding features 290 (alignment legs) which fit into the alignment slots 291 for self-alignment. Alternatively, protruding features can be formed in the mirror and/or actuator layers, and corresponding alignment slots can be formed in the spacer.

The mirror layer 21 can be made from a metal (preferably a high strength alloy or refractory metal), a ceramic (such as an oxide, nitride, carbide, fluoride or diamond) or a semiconductor (such as a single crystal silicon, polysilicon, or GaAs). In a preferred embodiment, the mirror layer consists of an array of 1–10 $\mu$m thick mirror membranes of Si in a somewhat thicker, base plate Si substrate (100–500 $\mu$m). It can be made by patterning and etching to form an array of mirrors, gimbals and torsion bars (or springs), using silicon wafer fabrication processing including the well-known SOI (silicon-on-insulator) fabrication method.

The actuator layer 22 is also preferably made by using silicon circuit fabrication methods. It contains an array of electrical circuits (not shown) to apply and regulate electric fields to each of the mirrors to actuate mirror tilting to the desired angle and orientation, electrical conductor lines, and interconnection/packaging contact pads, e.g., for wire bonding. The actuator layer 22 optionally has an additional, thin metallization layer (not shown) over its insulating surface (such as $SiO_2$) for the purpose of minimizing electrostatic charge accumulation and to provide electrostatic shielding between the mirrors.

The spacer 23 may be made of silicon, metal, polymer or ceramic and may be patterned from a sheet material with the desired thickness. The spacer material is patterned into desired size and configuration, e.g., by using lithography and etching process. It is desirable to have the spacer with the coefficient of thermal expansion (CTE) comparable to or not different by more than 50% from the base substrate material for the mirror layer or the actuator layer. The desired spacer material for the Si based MEMS (the CTE of Si is ~4×10$^{-6}$/° C.) has a CTE value comparable to that of Si or not different by more than 50%. Examples of such spacer materials include Si, metals such as Mo, W, Fe—Ni alloys (permalloys), Fe—Ni—Co alloys (Kovar), and ceramic materials.

In a variation of the invention the spacer 23 can be a pre-attached spacer patterned and bonded onto one of the mating parts, e.g., either on the mirror layer 21 or the actuator layer 22. These pre-attached spacers are desirably configured so that the boundary area between adjacent mirrors is at least partially compartmented or blocked for aerodynamically isolating the mirrors. The pre-attached spacer can be made of a metal or an alloy, silicon, ceramic, polyimide or plastic material. Plastic materials tend to outgas in a hermetically sealed atmosphere, and also have generally higher CTE values than metals or ceramics, and substantially higher than silicon which is often the base material for MEMS structure. Thus plastics are less preferred than inorganic materials such as metals, ceramics or silicon materials.

Pre-attached metallic spacers such as Cu, Ni, Fe, Co, Au, Pd, Mo, W and their alloys can be electroplated, evaporation deposited, or CVD deposited directly on the mirror part or the electrode part, and are then patterned into a desired configuration. For electrodeposition, the selective sites on the surface of the substrate have to be made electrically conductive by metallization or electroless coating of conductive seed layer. Silicon, silicon nitride, diamond, or other semiconductor or ceramic materials can also be directly deposited by CVD, RF sputtering or e-beam evaporation. A poly-silicon type spacer as thick as ~100 $\mu$m can be deposited, for example, by chemical vapor deposition process.

The use of electrically conducting spacers, e.g. spacers made of metals or polysilicon, is advantageous in avoiding electrostatic cross talk between neighboring mirrors, especially in high-density mirror array designs. In such devices where the adjacent mirrors are placed close to each other, the actuating electrostatic field from the electrodes can inadvertently affect the movement of the adjacent mirrors as the electric field applied can easily reach the edges of the neighboring mirrors or gimbals. In a preferred embodiment the spacers are made of highly conductive material so that they block the applied electric field controlling one mirror from reaching to the neighboring mirrors or gimbals. The desired electrical resistivity of the spacer material is less than 1 ohm-cm, preferably less than 1000 microhm-cm, and even more preferably less than 100 microhm-cm. It is further desirable to have the spacer essentially completely surrounding the cavity under the mirror so that aerodynamic shielding and electrostatic shielding are achieved simultaneously. The desired coverage of the wall area in the combined aerodynamic/electrostatic shield is at least 30%, preferably at least 50%, even more preferably at least 90% of the total available boundary area between the adjacent mirror cavities.

A further variation uses an electrostatically/aerodynamically isolating spacer made out of ferromagnetic material, such as magnetically soft material with low coercivity values. Fe—Ni alloys (permalloys) or Fe—Ni—Co alloys (Kovar) are particularly suitable as some of these alloys also exhibit relatively low coefficient of thermal expansion in the range of 2~7×10$^{-6}$/° C., comparable to the value for Si (~4×10$^{-6}$/° C.). The ferromagnetic spacer aligned to either the mirror layer or the actuator (electrode) layer can conveniently be held in place by magnetic force exerted by either the permanent magnet or the externally applied magnetic field, so that undesirable position shifts during assembly can be avoided or minimized.

A soft magnet cover 24 is desirably made of an easily magnetizable material with coercive force of less than 100 Oe, preferably less than 50 Oe, even more preferably less than 10 Oe. Suitable materials include permalloys (Ni-rich Ni—Fe alloys), silicon steel, and soft ferrites such as Ni—Zn ferrite or Mn-ferrite. These materials and their magnetic properties are described, for example, in B. D. Cullity, *Introduction to Magnetic Materials*, Addison-Wesley, Menlo Park, Calif., 1972. A permanent magnet cover 25 is desirably made of a magnetically hard material with high coercivity of at least 200 Oe, preferably at least 600 Oe, even more preferably at least 100 Oe. Known materials with such characteristics include Alnico, barium ferrite, samarium-cobalt, neodymium-iron-boron, or Fe—Cr—Co base magnets.

Figure 2C:
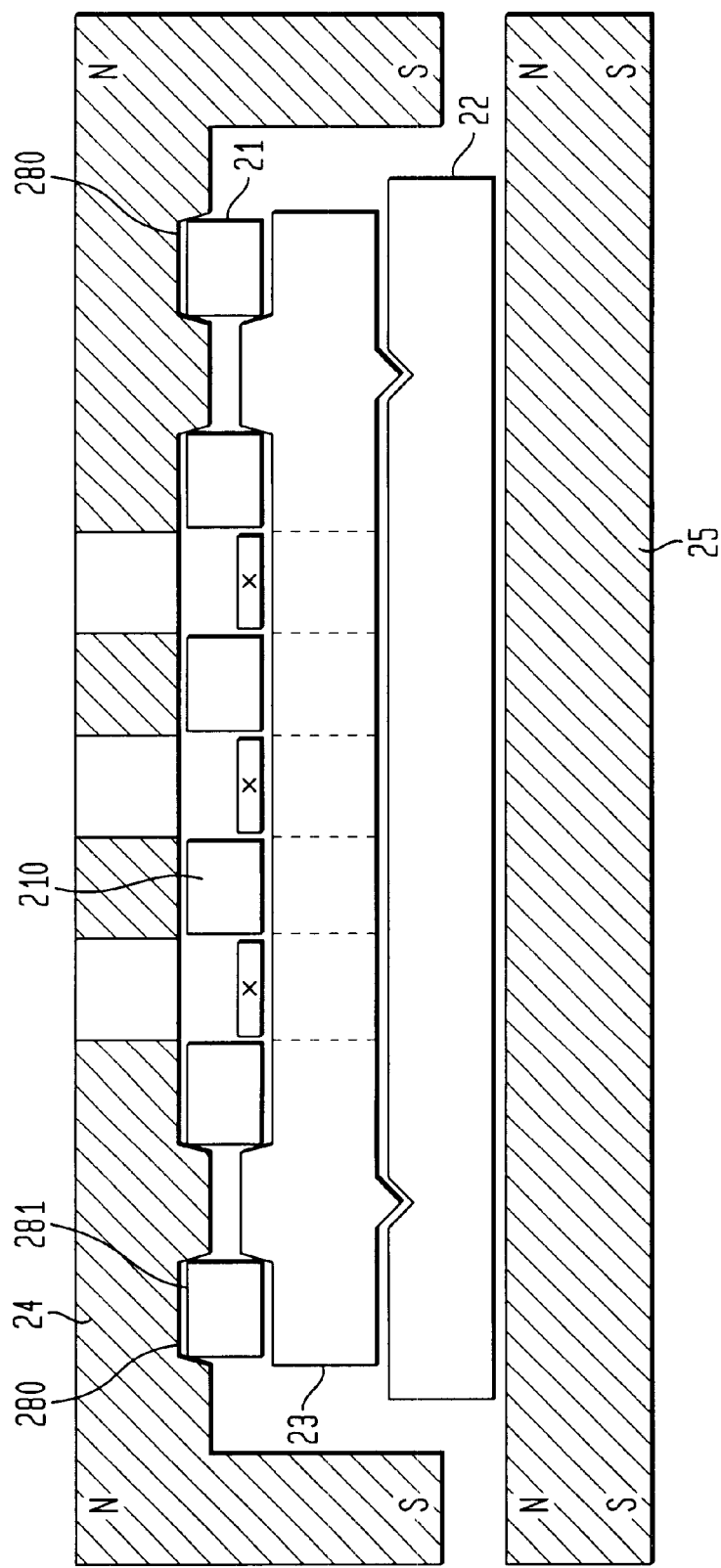
FIGS. 2(c) and 2(d) schematically illustrate alternative embodiments.

FIG. 2(c) illustrates an alternative embodiment of an optical MEMs device wherein i) the mating magnetic poles of the covers are closely spaced so that a stronger magnetic attraction force is obtained, and ii) the alignment of the upper magnetic cover relative to the mirror layer is assured by alignment slots 280 and protruding features 281 on either the magnet cover or on the mirror layer. At least two and preferably at least three alignment slots 280 are desired. Alternatively the edges of the cover 24 can be stepped to naturally fit onto the edges of the mirror layer. A similar edge-step configuration may be utilized for the bottom magnetic cover 25 so that it is aligned with the actuator layer above it.

Figure 2D:
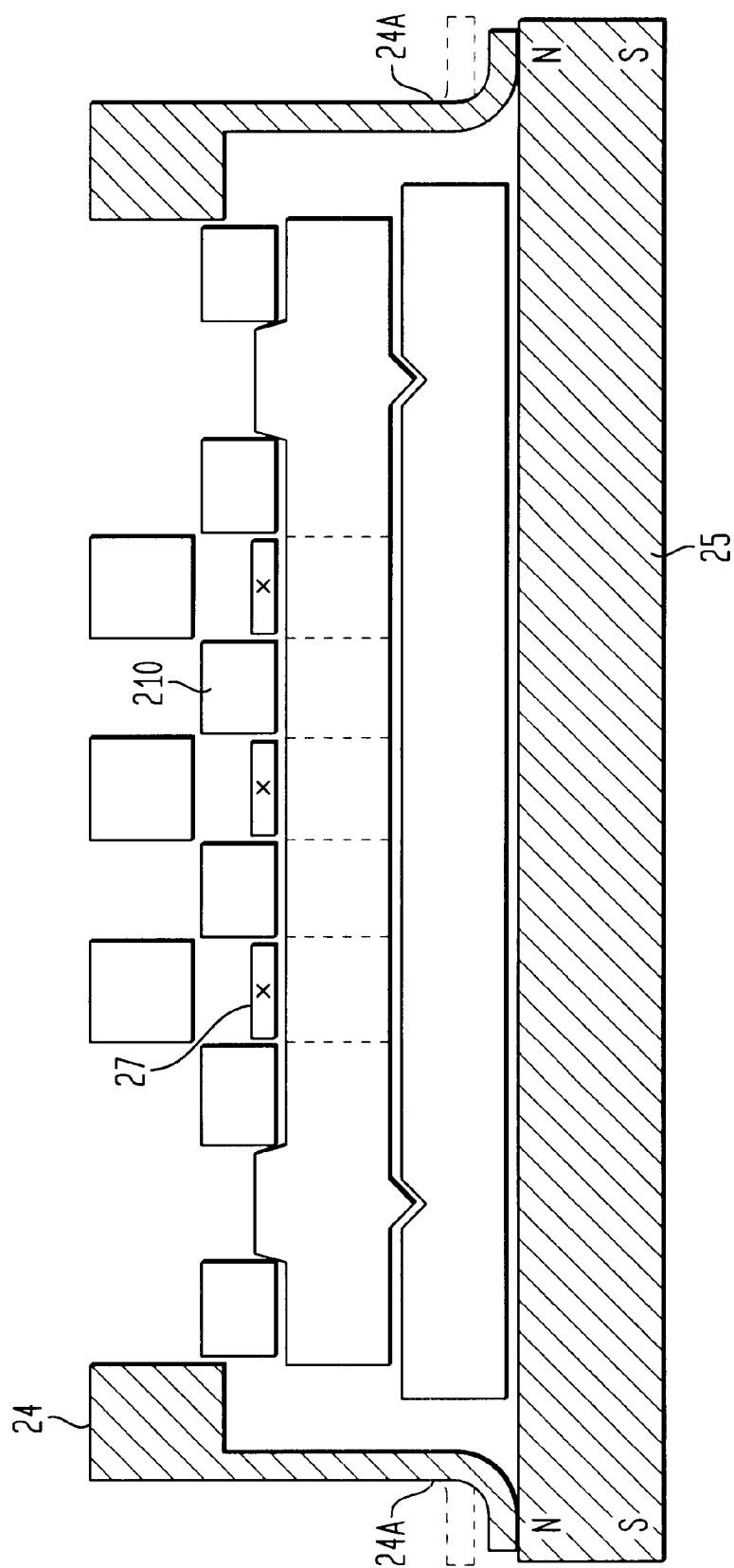

The upper and lower magnets can have a number of different shapes and sizes. For stronger magnetic attraction force, a thicker material with a larger surface coverage area is generally preferred. Also, the smaller the gap between the two attracting magnets, the stronger is the magnetic force. To utilize this behavior, yet another embodiment is illustrated in FIG. 2(d). Here, the end portions 24A of the upper magnet 24 (e.g., soft magnet) are made mechanically compliant so that these portions can elastically bend and the upper magnet can contact the lower magnet with no air gap for maximized magnetic attractive force. The resilience conveniently accommodates any variations in the heights of MEMS components or the magnet height, and ensures the desirable zero-gap magnetic attachment assembly without applying excessive force on the fragile MEMS components. The capable range of the vertical height variation accommodated by the resilience in the inventive structure is at least 5 $\mu$m, and preferably at least 20 $\mu$m.

Figure 3A:
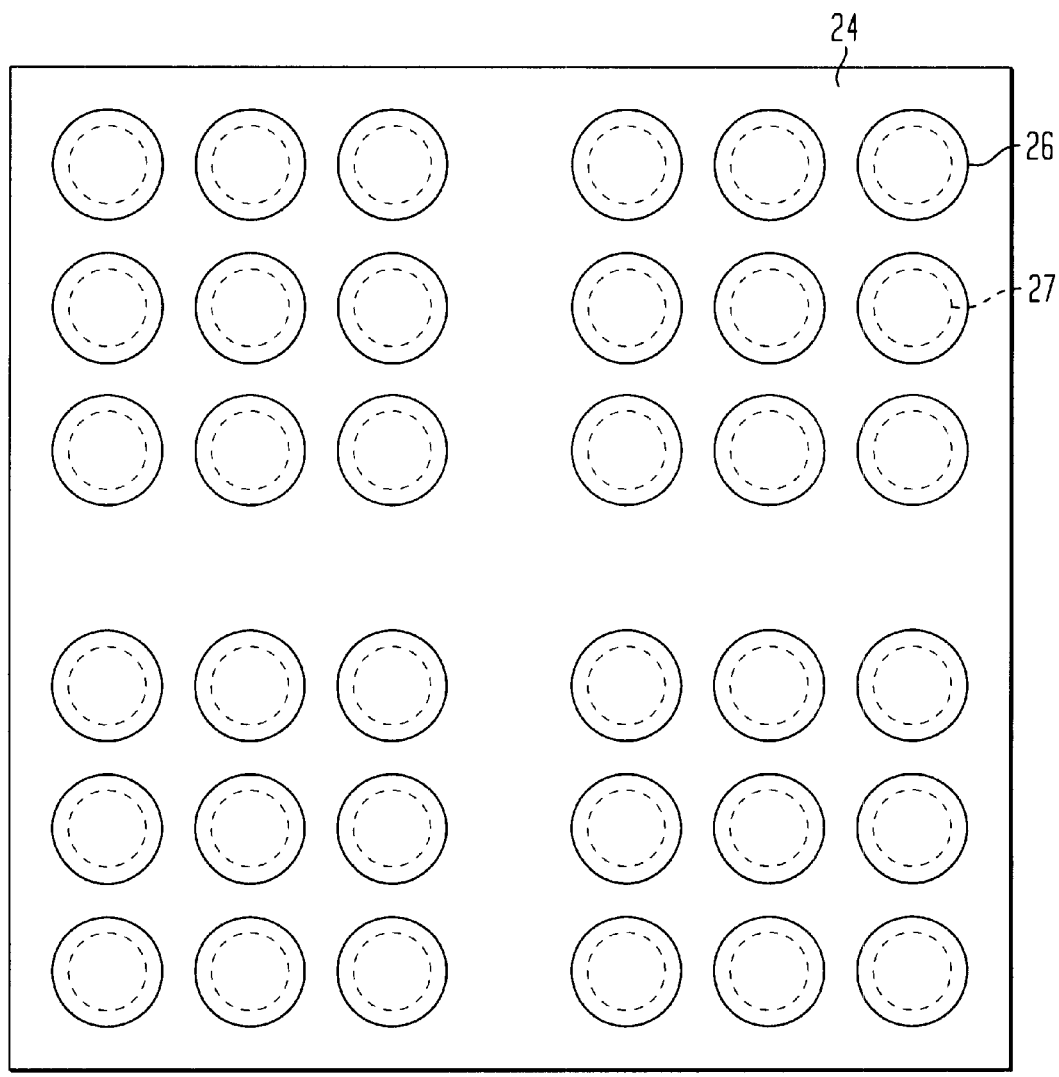
FIGS. 3(a), 3(b) and 3(c) are top views of exemplary magnetic covers that can be placed over the mirror layer.
Figure 3B:
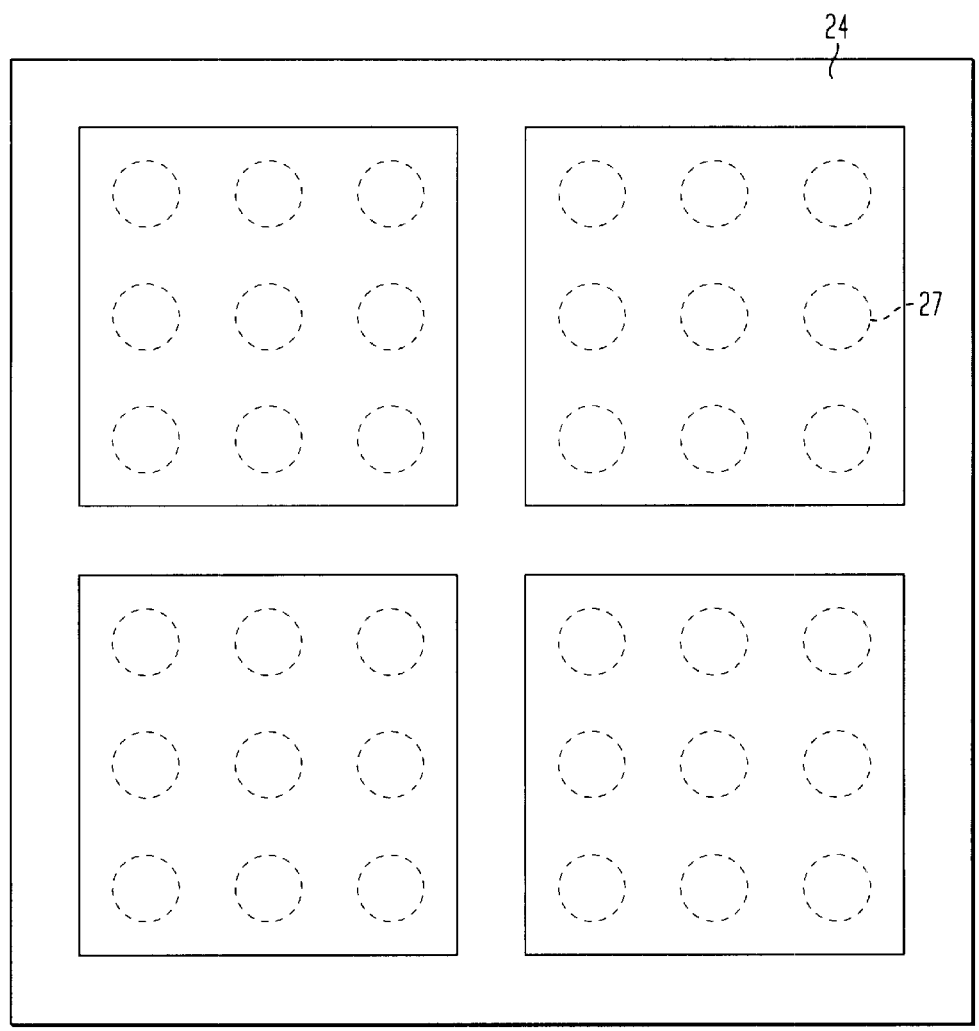
Figure 3C:
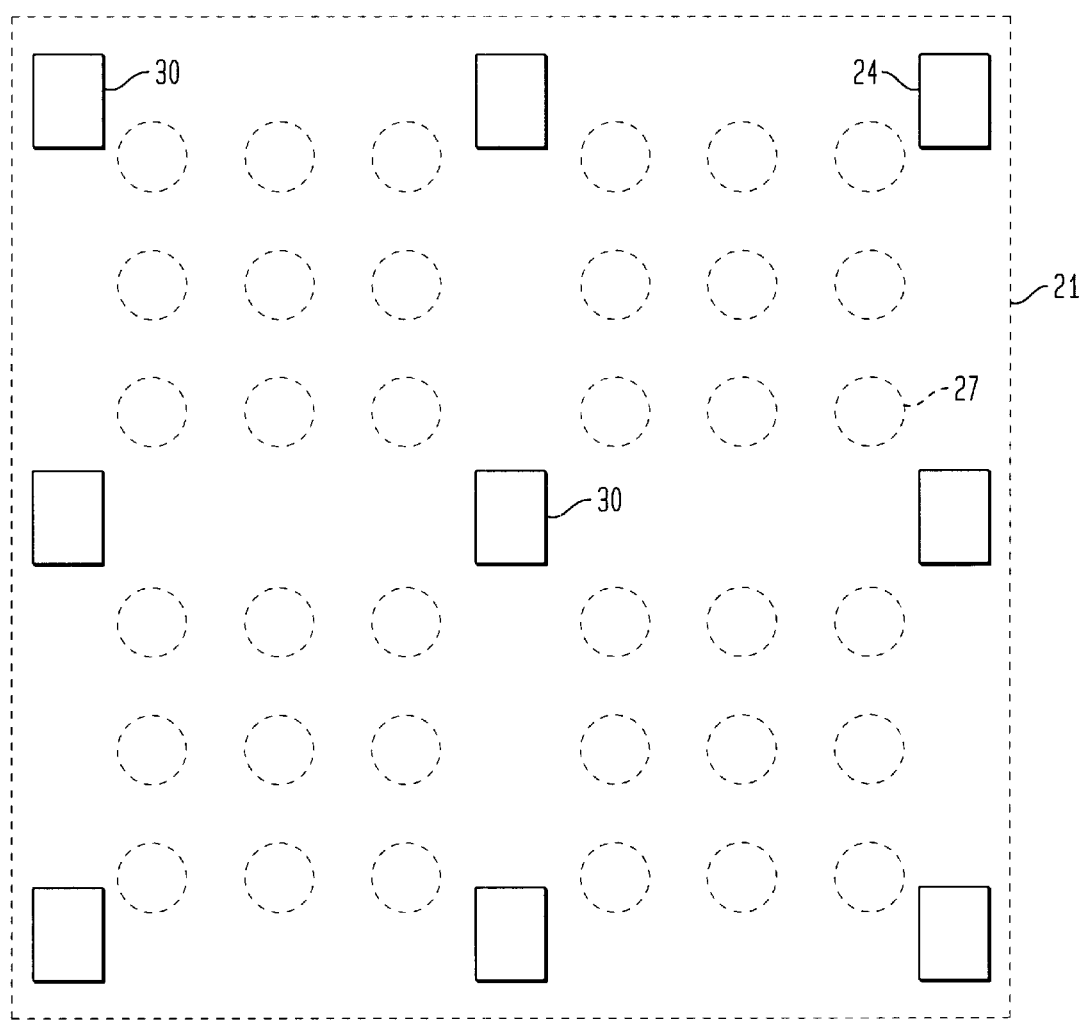

FIGS. 3(a), 3(b), and 3(c) illustrate three exemplary configurations of the upper magnet (e.g., the soft magnet) cover 24 to be placed above the mirror layer 21. As described earlier, the soft magnet cover is locked into place by geometrical fit using alignment slots or edge-step alignment such that the magnetic component does not interfere with the mirror tilting and the light reflection. A patterned, single-piece magnetic cover such as shown in FIG. 3(a) or 3(b) can be simply dropped in place.

FIG. 3(c) shows an alternative embodiment wherein separated magnets 30 are attached onto desired locations in the mirror layer base plate by, for example, epoxy or adhesive tapes. The shape of the bottom magnet (not shown) can have either an identical shape as the top magnet or can be different, e.g., it can have a simple rectangular or square plate shape. As mentioned before, the soft magnet and the permanent magnet can be switched, i.e., the permanent magnet can be used for the upper magnetic part and the soft magnet for the lower magnetic component, or both can be permanent magnets. The desired thickness of the soft and hard magnetic components is at least 10 µm, preferably at least 100 µm, even more preferably at least 500 µm.

If the MEMS OXC device 20 is made to operate in a vacuum environment or at a slow mirror tilting speed, the movement of one mirror may not have much influence on the neighboring mirrors. However, if vacuum environment is not used, then in a typical, relatively fast mirror movement (on the order of milliseconds), the tilting of each mirror can cause air turbulence and interfere with the operation and movement of adjacent mirrors. In order to minimize such interference, an aerodynamically isolating spacer can compartmentalize the air volume associated with the space underneath each mirror.

Figure 4A:
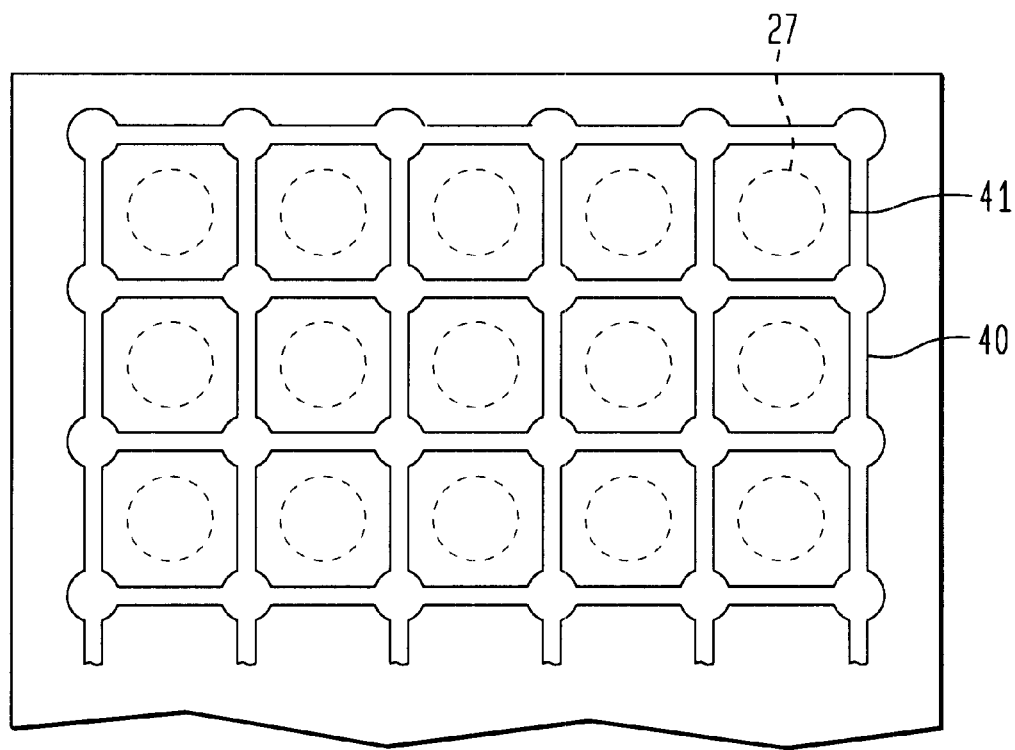
FIGS. 4(a), 4(b), 4(c) and 4(d) schematically illustrates exemplary spacers that can be placed between the mirror layer and the actuator layer.
Figure 4B:
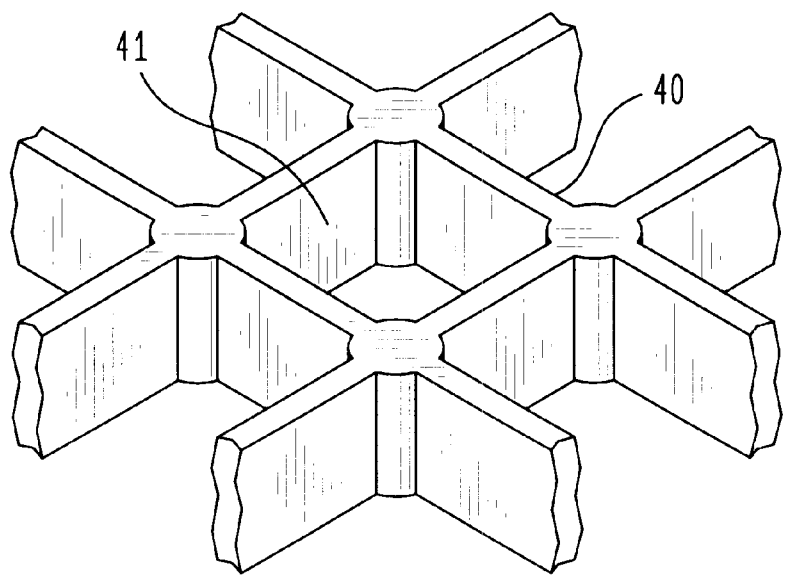

FIG. 4(a) schematically illustrates a top view of an exemplary spacer 40, which provides the aerodynamic isolation through the use of square-shaped compartments 41. A perspective view of this structure is given in FIG. 4(b).

Figure 4C:
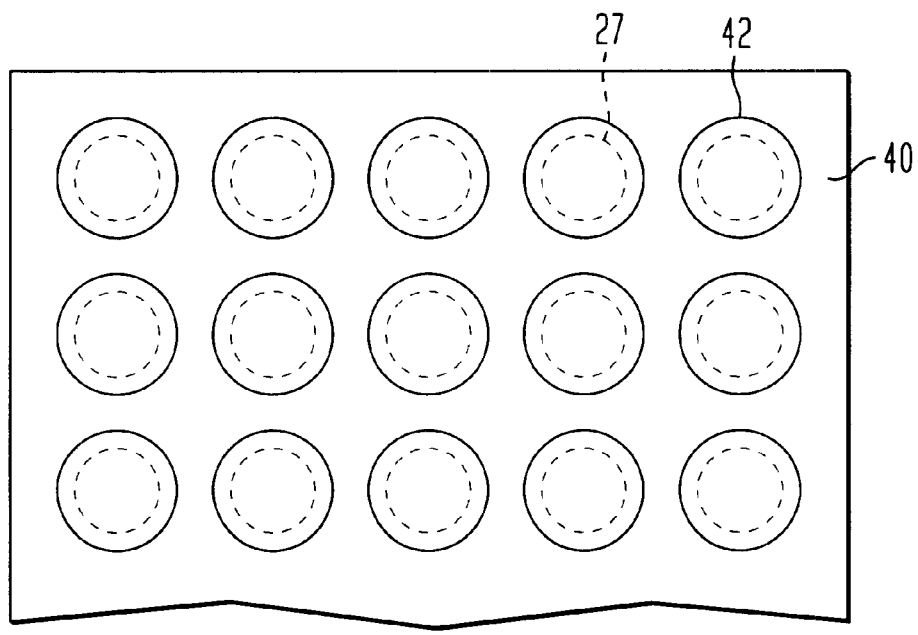
Figure 4D:
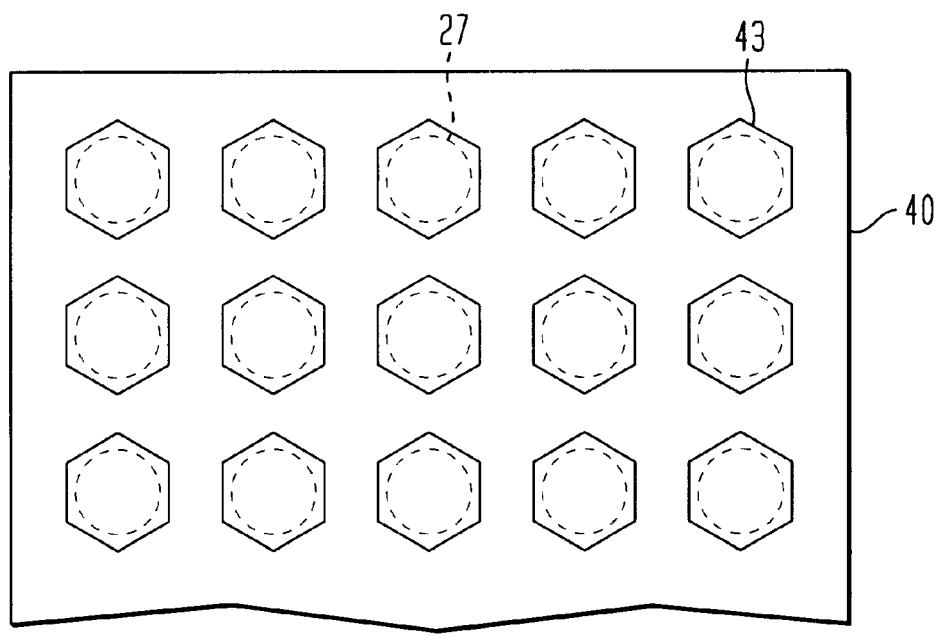

Other shapes such as circular compartments 42 may also be used as illustrated in FIG. 4(c). A spacer with hexagonal compartments 43 is shown in FIG. 4(d). Depending on the device performance requirement, the aerodynamic isolating walls need not be 100% isolating, i.e., broken walls are still better than no walls. In addition, the walls need not enclose every mirror 27, i.e., a reduced aerodynamic isolation by the walls for every 4 or 6 mirrors may be acceptable although not preferable. The fraction of the blocked wall area is advantageously at least 20%, preferably at least 50%, even more preferably at least 90%.

The assembled MEMS OXC device 20 comprises an array of tiltable mirrors 27, e.g., double gimbal cantilevered mirrors, which can be tilted to any desired orientation. The mirrors are electrically grounded and are tilted for optical signal routing via electrostatic actuation by one or more of the independently controllable electrodes placed in the bottom electrode layer underneath the mirror. An exemplary desired size of the mirrors suitable for optical MEMS applications is in the range of 50–10000 µm, preferably in the range of 200–2000 µm.

Figure 5:
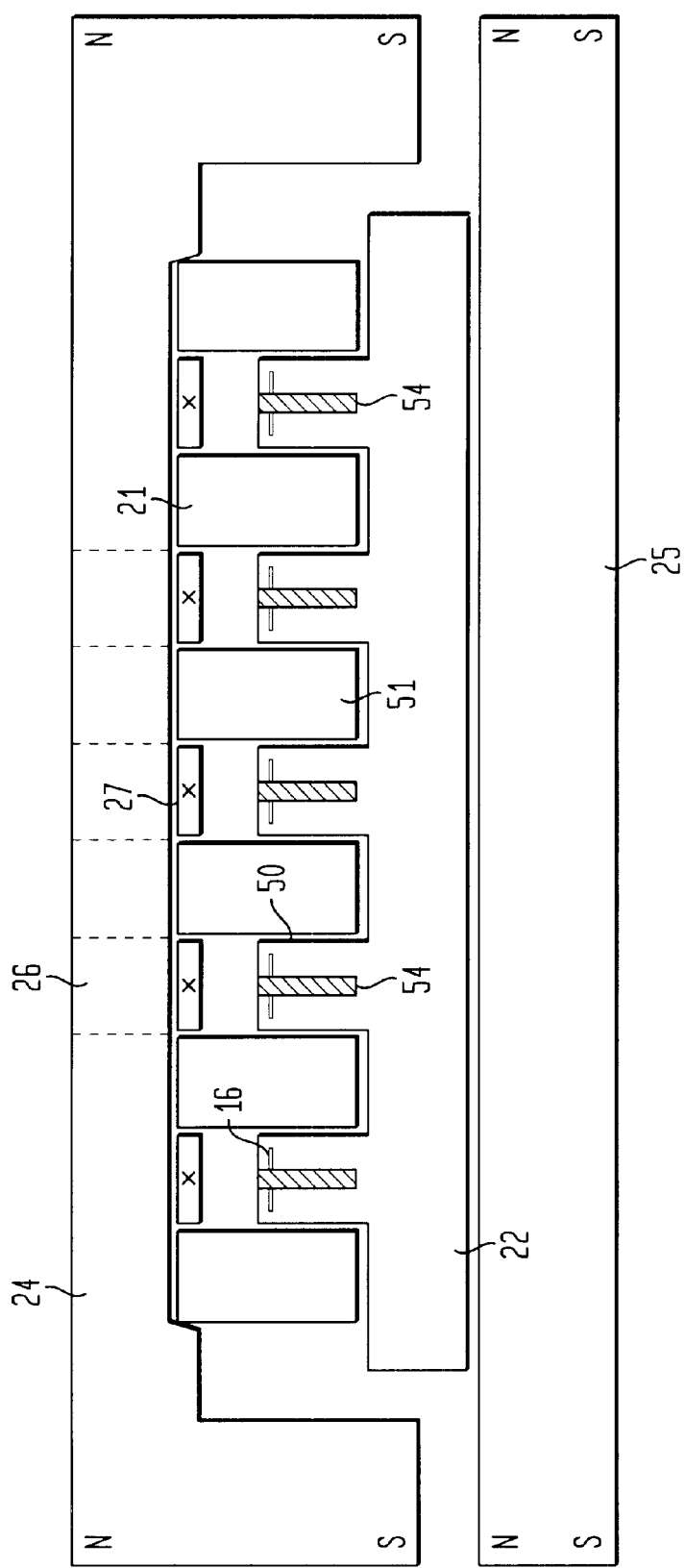
FIG. 5 is a cross-sectional view of a mesa-configured mirror layer and a mating actuator layer to be magnetically assembled.

Instead of the mirror layer and the actuator layer being both planar, one or both layers can include mesas 50 as illustrated in FIG. 5. In this configuration, portions 51 of the mirror layer 21 also serve as spacers dictating the vertical gap between the mirrors and the electrodes. Magnetic attraction force provided by the two magnets 24, 25 (with at least one of them being a permanent magnet) keeps the mirror layer and the actuator layer in place, with the lateral alignment provided either by the mesas 50 or by the use of alignment slots and protruding features.

In these embodiments the mirror layer can be fabricated on a silicon-on-insulator substrate comprising a first layer of silicon, a layer of $SiO_2$ and a second layer of silicon. The thin silicon mirror can be made using the well-known silicon-on-insulator (SOI) fabrication process. The SOI process permits convenient fabrication of the thin silicon mirrors, and the presence of the buried oxide layer is useful as an etch-stop barrier. Selected patterned areas of the upper portion of the SOI substrate are etched, e.g., by using chemical etch, reactive-ion etch, or a combination of these processes to form the mirror array. The gimbals and the torsion bars (not shown) are also formed around each mirror. The SOI material and process are described, for example, in Concise *Encyclopedia of Semiconducting Materials and Related Technologies,* Edited by S. Mahajan and L. C. Kimmerling, Pergamon Press, New York, 1992, p. 466.

Since the movable mirror is typically thin and fragile with about 1–10 micrometer thickness for the ease of movement, the mirror layer substrate base which carries the mirrors and gimbals is advantageously substantially thicker than the movable mirror membrane to provide mechanical stability to the structure. The desired thickness of the SOI substrate for MEMS mirror applications is typically in the range of 50–1000 micrometers and preferably 200–500 micrometers. The SOI material is etched in such a way that the patterned thicker portion of the mirror-carrying substrate is facing up, while the smooth surfaced portion is facing down toward the actuator layer. In this embodiment, the mirror is formed on the layer of silicon proximal the actuation layer.

In FIG. 5, the mirror-carrying SOI substrate 21 is turned upside-down so that the thicker portion 51 of the substrate 21 is conveniently utilized as an inherent (pre-existing) spacer. The mirror is formed on the layer of silicon distal from the actuation layer, and the layer of silicon proximal the actuation layer is configured to at least partially enclose the region underlying the mirror between the mirror and the actuation layer. Since the typically preferred thickness of the mirror-carrying substrate is at least 200 micrometers for mechanical sturdiness, this gap may be too large for easy, low-voltage actuation of the electrostatic operation of the MEMS mirrors. In order to overcome this complication, the actuator electrodes 16 are optionally raised, so that relatively low voltage operation is possible. Such mesas 51 can be achieved by deposition of polysilicon, glass, metal or composite material base by chemical vapor deposition, physical vapor deposition, or electrochemical deposition.

One way of making such electrical connections to the raised electrodes is to use via holes 54 in combination with mesas 50 fabricated by silicon processing. The protruding mesa 50 can be made to fit into a cylindrical cavity that is part of the spacer wall structure. The vertical via holes 54 are metallized with metallic thin film deposition, polysilicon deposition, or with conductive polymer composite fillers. The via holes 54 are electrically connected to underlying conducting electrical interconnection wires (usually thin film aluminum lines) which are connected, for example, via wire bonding to the electrical circuitry and a power supply source (not shown).

The device of FIG. 5 is particularly useful for the following reasons: 1) enclosing spacer walls (regions 51) prevent or minimize the aerodynamic cross-talk of mirror operation, 2) the silicon proximal the actuation layer can be p-type or n-type doped, or coated with conducting material to reduce or eliminate electrostatic cross-talk and thereby shield the mirror, 3) since the upper surface of the mirror is flat with no protruding substrate portion, there is no significant anomalous light reflection from the corners or walls of protruding portions, and 4) the required electrical grounding of the mirror layer and the spacer layer is easily done.

Yet another alternative embodiment of using the inherent spacer as a part of the base MEMS structure is to produce the spacer on the actuator layer instead of the mirror layer. This can be accomplished by carrying out the silicon etch and patterning process on the electrode layer in such a way that a protruding silicon spacer of desired thickness, either as isolated islands or as a continuous wall, is present on the top surface of the electrode layer.

Another variation is the placement of one or more stiffener plates on top of the mirror layer. The upper magnet is then placed over the stiffener plate, various MEMS components (upper magnet, mirror layer, spacer electrode layer) are aligned and magnetically assembled at room temperature. The stiffener plate is preferably made of optically transparent material such as quartz plate, glass, diamond sheet, sapphire, or $LiNbO_3$. The desired thickness of the stiffener plate is at least 50 μm, preferably at least 250 μm. The presence of the stiffener plate makes the compressive stress applied on to the MEMS assembly more uniform, and also protects the fragile MEMS device during handling or subsequent processing.

The magnetic assembly process for the MEMS device package requires care. Bringing together two magnetic components to clamp on the MEMS parts, if not done with care, can cause the magnets to forcefully collide. Advantageously, the magnetic assembly is carried out as follows. The bottom magnet 25 is temporarily magnetically fixed in position on a support platen using, e.g., an electromagnet or a permanent magnet underneath. The mirror part 21, the actuator part 22 and the spacer part 23 (if not pre-attached already) are then brought together on the platen and laterally aligned, e.g., using alignment slots and protruding features. The upper magnet 24 (either soft or permanent) is picked up by vacuum suction holder or mechanical grip, brought over the aligned mirror-spacer-electrode assembly, gently lowered and aligned with the mirror part, e.g., using one or more micro-positioning machine systems which may be optionally guided by precision camera vision, and then released by cutting off the vacuum so that the combination of the upper and the lower magnets apply compressive force and lock-in the assembled MEMS structure. The magnetic field supplied from underneath the platen is then removed so that the magnetically assembled device can be retrieved. In an alternative process, instead of using the vacuum suction holder or a mechanical grip, a portable or movable electromagnet (e.g., a pole piece iron core rod with current carrying solenoid wound around it) may be utilized to pick-up the upper magnet and place it over the MEMS assembly so that the magnetic lock-in of the device assembly by the two magnet takes place. The current in the portable electromagnet rod is then switched off and the portable electromagnet is slid away (or a reverse polarity current is applied if the upper magnet is a permanent magnet so as to magnetically repel it away from the portable electromagnet). The strength of the portable electromagnet is adjusted so that its magnetic force on the upper magnet is sufficient to carry and place it over the mirror part in a stable manner, but is not as strong as the gripping force on the upper magnet by the lower magnet, especially if the portable magnet in contact with the upper magnet over the MEMS device is tilted, i.e., so that only one point of a circular bottom surface (or one edge of a square bottom surface) of the pole piece iron rod is now in contact with the upper magnet. In such a tilted position, the portable electromagnet can easily be slid off the upper magnet.

The magnetically packaged optical MEMS device with accurate mirror-electrode alignment and spacing is useful as a reliable optical channel crossconnect for signal re-routing or signal modification in an optical communication system. In a crossconnect similar to FIG. 1(b), each mirror of a MEMs device described herein receives an optical signal from an input fiber and reflects it toward an intended output fiber.

Figure 6:
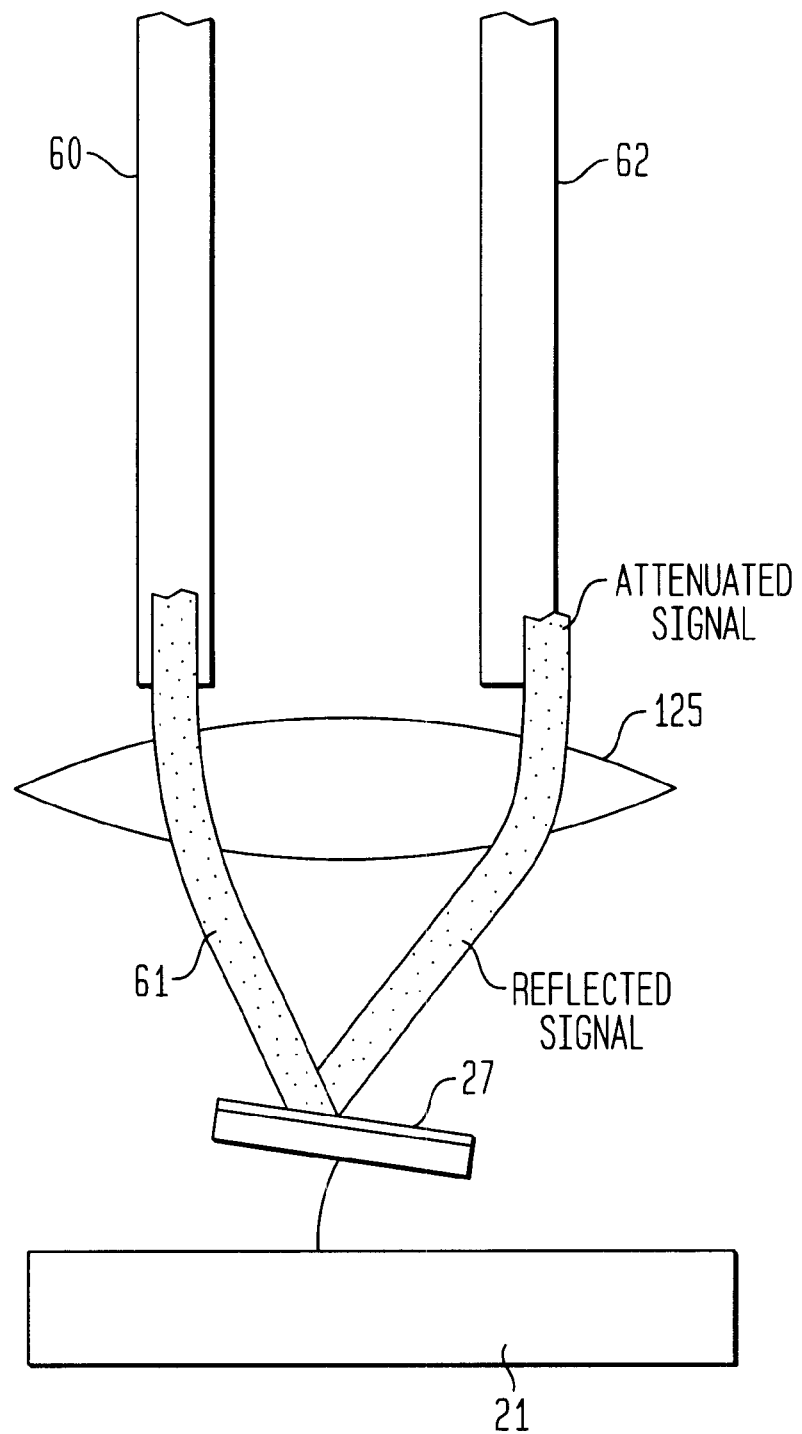
FIG. 6 schematically illustrates a variable attenuator.

The inventive device is also useful for various other light-reflecting mirror systems such as power equalizers, variable attenuators, optical add/drop and switches. FIG. 6 illustrates a variable attenuator using the common principle upon which such systems are based. Assume that an input fiber 60 transmits an input signal 61 to be attenuated and sent to output fiber 62. Then controllable mirror 27 is positioned for receiving signal 61 and is oriented for reflecting the signal so that only a portion of the reflected signal enters the output fiber 62. Fine control of the mirror orientation permitted by the accurate spacing and alignment of the magnetically packaged assembly permits fine control of the degree of attenuation. Thus the magnetically packaged devices and arrays described hereinabove can be used as variable attenuators, optical switches, add drop switches, and power equalizers.

Figure 1A:
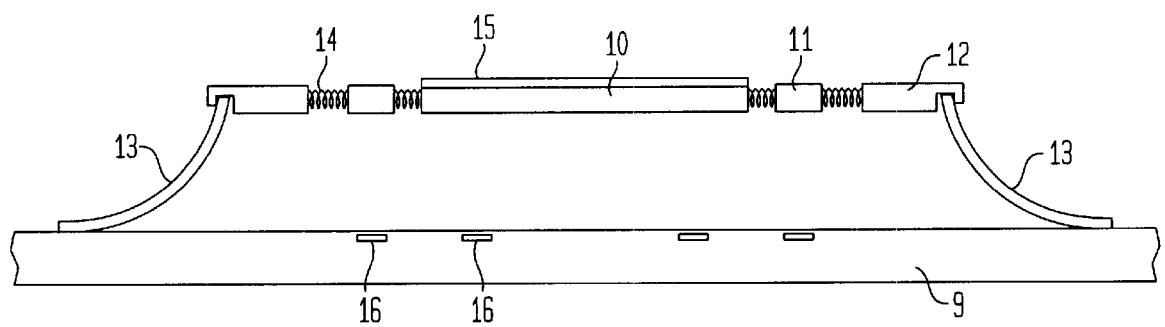

For a switch or an add/drop switch, in an arrangement similar to FIG. 1(b), the mirror for a channel to be switched off, dropped or rerouted is oriented to reflect the input signal to a different output fiber or to no output fiber, as desired. Hence the signal is rerouted, dropped or switched off. A channel is readily added to an output fiber by a mirror reoriented to reflect a new input to the output.

An important application relating to power equalization concerns optical fiber amplifiers. By way of background, multi-wavelength optical communication systems require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels leads to high bit error rates in some of the channels. As the number of channels passing through the amplifier changes by channel add/drop reconfiguration, the amplifier will start showing deleterious peaks in its gain spectrum at some wavelength channels, requiring modification of the signal spectrum and flattening of the amplifier gains.

A novel dynamic gain equalizer is based on MEMS optical devices with convenient and reliable solder packaging and improved accuracy of mirror-electrode spacing. The optical signal gain in each wavelength channel can be independently (and simultaneously with other channels) controlled by the MEMS optical mirror, which reflects that particular signal. The mirrors in this case do not have to be tiltable in all orientations. A simple bending of a cantilever beam structure, desirably with a light-reflecting metal surface, can serve the purpose of gain equalizing. In addition, the mirrors do not have to be in circular shape. They can be square, rectangular, or of any elongated shape. The multiplexed optical is demultiplexed using suitable demultiplexers such as planar waveguides or thin film devices, with each of the separated wavelength channel signal being sent to each MEMS mirror and reflected. By programmably selecting the tilt (or bend) angle of relevant mirrors slightly off the angle of maximum signal reflection, the losses for various channels can be intentionally increased to different degrees for the purpose of gain equalizing. The stability of mirror operation enhanced by the inventive magnetically packaged optical MEMS devices is crucial in ensuring the accuracy of dynamic gain control by different mirrors.

Figure 7:
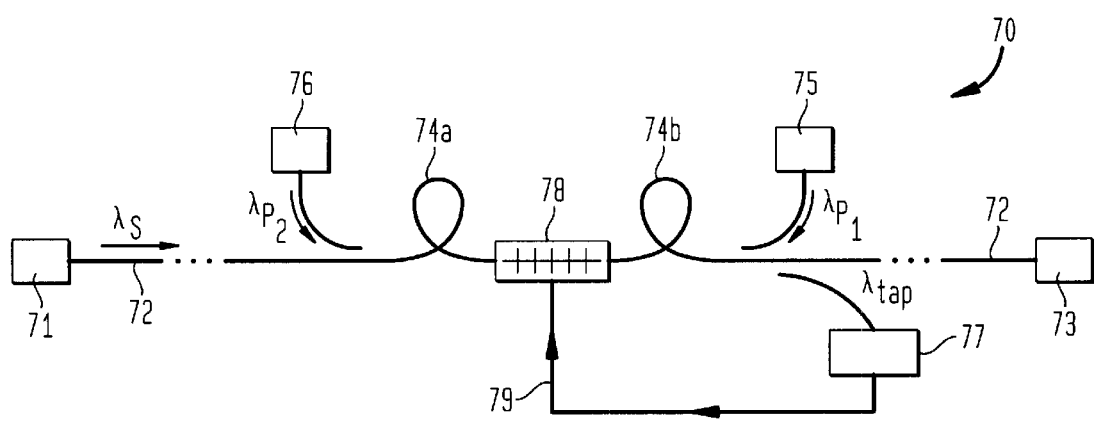
FIG. 7 schematically illustrates a dynamic gain equalizer based on an optical MEMS device according to the invention.

FIG. 7 schematically illustrates an exemplary optical communication system comprising a magnetically packaged MEMS mirror structure as a gain equalizer. The system 70 comprises dynamically gain-equalized optical amplifiers, a reconfigurable MEMS mirror spectral shaping device, and a feedback device. Specifically, the system 70 comprises a transmitter source 71 of optical signals such as a digitally modulated 1.55 μm signal, an optical signal path comprising a length of optical fiber 72 for transmitting the signal, and a receiver 73 for receiving and demodulating the signal. One or more optical amplifiers, such as erbium-doped fiber amplifiers 74a, 74b, are disposed in the optical signal path for amplifying the transmitted signal. The amplifiers are pumped by pump sources 75, 76, of optical energy of pump wavelengths $\lambda_{p1}$ and $\lambda_{p2}$.

One of the preferred uses of the device of FIG. 7 is to reduce spectral dependence in the gain output of an optical amplifier. For example, the characteristic gain spectrum of an erbium-doped optical fiber amplifier has a pair of gain peaks at about 1.53 μm and at about 1.56 μm. Thus, a signal at 1.53 μm will be amplified more than one at 1.54 μm, which would be disadvantageous in a wavelength division multiplexing (WDM) system.

By properly demultiplexing the optical signal and sending to different light-reflecting mirrors for separately programmed attenuation of signal strengths, and by optional tuning of the mirror reflections via a feedback system, the gain spectrum of the amplifier device combination can be made substantially flat over a range of wavelengths. The tuning mechanism 78 comprises a demultiplexer combination with a tunable light-reflecting MEMS mirror device and a multiplexer to put together the different wavelength channels into the optical fiber. The mechanism 78 is connected to a feedback system 79, having a wavelength detector 77 coupled to the fiber 72 for detecting the wavelength response $\lambda_{tap}$. The feedback system 79 automatically adjusts the tuning of the mechanism 78 depending upon $\lambda_{tap}$. Advantageously, system 70 can be a WDM system using a plurality of different wavelength signals, e.g. $\lambda_{s1}$ and $\lambda_{s2}$, and a plurality of tunable MEMS mirror devices coupled to one or more detectors.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A magnetically-packaged optical micro-electro-mechanical (MEMS) device comprising:
   a) a mirror layer having a frame and at least one mirror, each mirror movably connected to the frames;
   b) an actuator layer having at least one conductive path and at least one electrode, each electrode capable of inducing movement in the mirror;
   c) at least one spacer to separate the mirror layer and the actuator layer by a vertical gap spacing, the spacing being separate from or part of the mirror layer and/or the actuator;
   d) a first body of magnetic material disposed distally with respect to the mirror layer or secured thereto;
   e) a second body of magnetic material disposed distally with respect to the actuator layer or secured thereto;
   f) wherein the mirror layer, spacer and actuator layer are held in laterally-aligned and vertically spaced relation by magnetic attractive force between the first and second bodies of magnetic material.

2. The MEMs device of claim 1 wherein the mirror layer and the actuator layer have facing surfaces, each having a planar configuration.

3. The MEMs devices of claim 1 wherein the mirror layer or the actuator layer has a mesa configuration.

4. The MEMs device of claim 1 wherein the mirror layer, the spacer, the actuator layer, and the first and second bodies are laterally self-aligned by alignment slots, protruding features, or stepped edges present in one or more of the layers or bodies.

5. The MEMs device of claim 1 wherein the spacer aerodynamically isolates the mirror by blocking at least 30% of the peripheral area underlying the mirror.

6. The MEMs device of claim 1 wherein the first body has a cavity to allow a light signal to reach the mirror surface.

7. The MEMs device of claim 6 wherein the first body has a thickness of at least 5% of the mirror diameter.

8. The MEMs device of claim 1 wherein the first body or the second body comprises soft magnetic material having a coercive force of less than 50 Oe.

9. The MEMs device of claim 1 wherein the first body or the second body comprises permanent magnetic material having a coercive force of at least 200 Oe.

10. The MEMs device of claim 1 wherein the second body has a mirror image pattern of the first body.

11. The MEMs device of claim 1 wherein the mirror layer comprises single crystal silicon.

12. The MEMs device of claim 1 wherein the mirror layer comprises polycrystalline silicon.

13. The MEMs device of claim 1 wherein the movable mirror comprises a coating of metal.

14. The MEMs device of claim 1 wherein the spacer has a coeffecient of thermal expansion (CTE) different from the mirror layer and the actuator layer by not more than 50%.

15. The MEMs device of 14 wherein the spacer comprise a material selected from Si, Mo, W, Zr, Hf, or Ta.

16. The device of claim 1 wherein the first and second bodies of magnetic material are resiliently coupled.

17. The device of claim 1 wherein the range of resilient coupling is at least 5 micrometers.

18. The device of claim 1 wherein the spacer is comprised of ferromagnetic material.

19. The device of claim 1 wherein the first body is distal with respect to the mirror layer and further comprises a transparent plate disposed between the first body and the mirror layer.

20. The device of claim 1 wherein the spacer includes walls defining a cavity below the mirror and the walls are conductive to electrostatically isolate the cavity.

21. The device of claim 20 wherein the walls substantially cover the peripheral area around the cavity to aerodynamically isolate the cavity.

22. A optical micro-electro-mechanical (MEMS) device comprising:
   a) A component layer having a frame and at least one component, each component movably connected to the frame;
   b) an actuator layer having at least one conductive path and at least one electrode, each electrode capable of inducing movement of the component;
   c) at least one spacer to separate the component layer and the actuator layer by a vertical gap spacing, the spacer being separate from or part of the component layer and/or the actuator layer;
   d) a first body of magnetic material disposed distally with respect to the component layer or secured thereto;
   e) a second body of magnetic material disposed distally with respect to the actuator layer or secured thereto;
   f) wherein the component layer, spacer and actuator layer are held in laterally-aligned and vertically spaced relation by magnetic attractive force between the first and second bodies of magnetic material.

23. The MEMs device of claim 22 wherein the component layer and the actuator layer have facing surfaces, each having a planar configuration.

24. The MEMs devices of claim 22 wherein the component layer or the actuator layer has a mesa configuration.

25. The MEMs device of claim 22 wherein the component layer, the spacer, the actuator layer, and the first and second bodies are laterally self-aligned by alignment slots, protruding features, or stepped edges present in one or more of the layers or bodies.

26. The MEMs device of claim 22 wherein the spacer aerodynamically isolates the component by blocking at least 30% of the peripheral area underlying the component.

27. The MEMs device of claim 22 wherein the first body has a cavity to allow a light signal to reach the component.

* * * * *